(12) United States Patent
Chang et al.

(10) Patent No.: US 7,468,327 B2
(45) Date of Patent: Dec. 23, 2008

(54) METHODS OF FABRICATING A MICROMECHANICAL STRUCTURE

(75) Inventors: Chia-Hua Chang, Pingtung (TW);
Hua-Shu Wu, Hsinchu (TW);
Tsung-Mu Lai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 94 days.

(21) Appl. No.: 11/451,424

(22) Filed: Jun. 13, 2006

(65) Prior Publication Data
US 2007/0287213 A1 Dec. 13, 2007

(51) Int. Cl.
*H01L 21/31* (2006.01)
(52) U.S. Cl. .............. 438/758; 438/780; 257/E21.026; 257/E21.027
(58) Field of Classification Search ......... 438/689–794, 438/758, 780
See application file for complete search history.

(56) References Cited

U.S. PATENT DOCUMENTS 5,638,946 A * 6/1997 Zavracky .................... 200/181
6,617,185 B1   9/2003 Geisberger
6,621,022 B1 * 9/2003 Ma et al. .................... 200/267
6,908,781 B2 * 6/2005 Anderson et al. ............. 438/50

\* cited by examiner

*Primary Examiner*—W. David Coleman
*Assistant Examiner*—Khiem D. Nguyen
(74) *Attorney, Agent, or Firm*—Birch, Stewart, Kolasch & Birch, LLP (57) ABSTRACT

Methods of fabricating a microelectromechanical structure are provided. An exemplary embodiment of a method of fabricating a microelectromechanical structure comprises providing a substrate. A first patterned sacrificial layer is formed on portions of the substrate, the first patterned sacrificial layer comprises a bulk portion and a protrusion portion. A second patterned sacrificial layer is formed over the first sacrificial layer, covering the protrusion portion and portions of the bulk portion of the first patterned sacrificial layer, wherein the second patterned sacrificial layer does not cover sidewalls of the first patterned sacrificial layer. An element layer is formed over the substrate, covering portions of the substrate, the first patterned sacrificial layer and second patterned sacrificial layer. The first and second patterned sacrificial layers are removed, leaving a microstructure on the substrate.

8 Claims, 7 Drawing Sheets

METHODS OF FABRICATING A MICROMECHANICAL STRUCTURE

BACKGROUND OF THE INVENTION

1. Field of the Invention

The present invention relates to a method of fabricating a micromechanical structure, and in particular to a method of preventing peeling or cracking between sacrificial layers in the fabrication of a microelectromechanical structure (MEMS).

2. Description of the Related Art

Microelectromechanical structures (MEMS) have found applications in inertial measurement, pressure sensing, thermal measurement, micro-fluidics, optics, and radio frequency communications, and the range of applications for these structures continues to grow. Conventional microelectromechanical structures, such as accelerometers, pressure sensors, flow sensors, microactuators and the like, typically comprise suspended microstructures having a space or gap between a released portion and a substrate and one or more posts attached the substrate.

Figure 1:
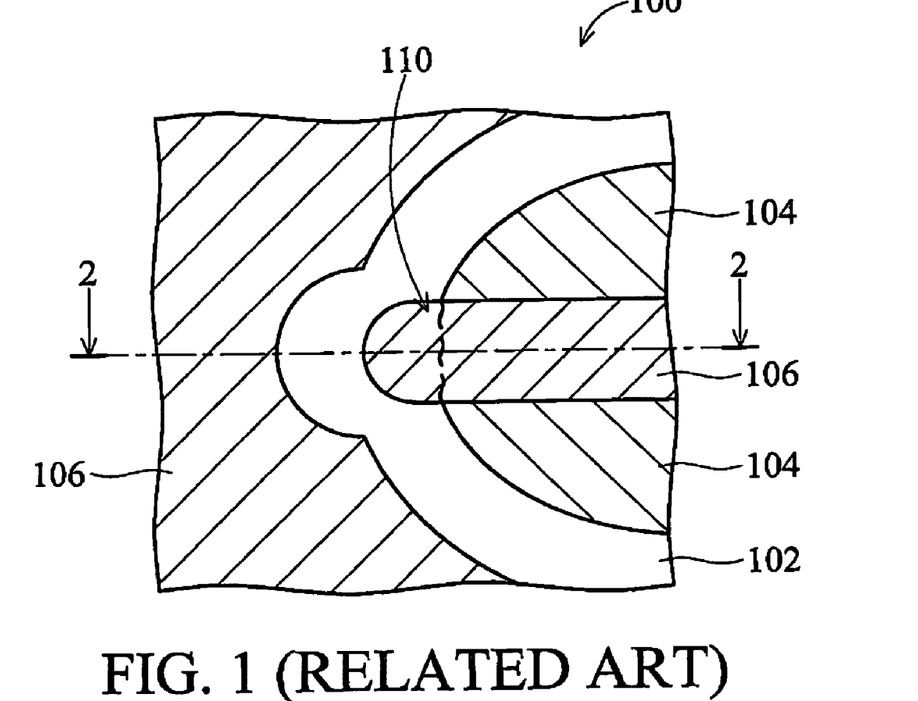
FIG. 1 is schematic top view showing a structure for fabricating a microelectromechanical element according to the related art.
Figure 2:
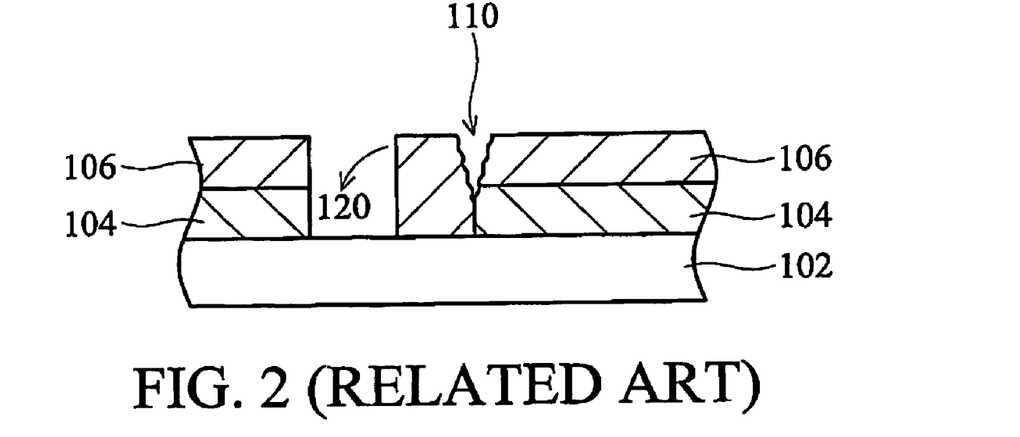
FIG. 2 is a schematic cross section taken along line 2-2 of FIG. 1, showing a part of the microstructure for fabricating a microelectromechanical element according to the related art.

FIGS. 1-2 are schematic diagrams showing a method for fabricating a suspended microstructure in the related art. FIG. 1 shows a schematic top view of a microelectromechanical structure 100 and FIG. 2 shows a schematic cross section taken along line 2-2 of FIG. 1.

Referring now to FIGS. 1 and 2, the microelectromechanical structure 100 is provided with two different patterned sacrificial layers 104 and 106 sequentially formed on a substrate 102, serving as a mold for forming a microelectromechanical element. Preferably, the patterned sacrificial layers 104 and 106 comprise photosensitive materials such as photoresists, photosensitive polymers or other materials and can be therefore patterned by a method such as photolithography. Fabrication of the patterned sacrificial layers 104 and 106 are described as follows. A first layer of photosensitive material can be blanketly formed on the substrate 102 by methods such as spin coating or similar and is then patterned by photolithography step and a following development, thereby forming the sacrificial layer 104 and exposed portions of the substrate 102. Next, a second layer of photosensitive material can be blanketly formed over the substrate 102, covering the underlying sacrifical layer 104 and the exposed substrate 102. Next, another photolithography step and a following development are performed on the second layer of photosensitive material, thereby forming the sacrificial layer 106 and exposing portions of the sacrificial layer 104 and the substrate 102.

As shown in FIGS. 1 and 2, portions of the sacrificial layer 106 now protrude over a portion of the substrate 102 adjacent to the sacrificial layer 104 and covers portions of the sidewall of the underlying sacrificial layer 104. This may cause cracking or peeling, such as the cracking 110 shown in FIGS. 1 and 2, where the sacrificial layer 106 covering sidewalls of the underlying sacrificial layer 104 meet since stress are induced due to photolithography and development during formation of the sacrificial layer 106. Part of the sacrificial layer 106 adjacent to the cracking 110 may even fall toward a direction 120 illustrated in FIG. 2, thus deforming the shape of the mold 100 and causing deformation of a lateral suspended microstructure (not shown) formed over the microelectromechanical after removal of the sacrificial layers 104 and 106.

Therefore, an improved method of fabricating a microelectromechanical structure is desired.

BRIEF SUMMARY OF THE INVENTION

Methods of fabricating a microelectromechanical structure are provided. An exemplary embodiment of a method of fabricating a microelectromechanical structure comprises providing of a substrate. A first patterned sacrificial layer is formed on portions of the substrate, the first patterned sacrificial layer comprising a bulk portion and a protrusion portion. A second patterned sacrificial layer is formed over the first sacrificial layer, covering the protrusion portion and portions of the bulk portion of the first patterned sacrificial layer, wherein the second patterned sacrificial layer does not cover sidewalls of the first patterned sacrificial layer. An element layer is formed over the substrate, covering the substrate, the first patterned sacrificial layer and second patterned sacrificial layer. The first and second patterned sacrificial layers are removed to thereby leave a microstructure on the substrate.

An exemplary embodiment of a mold for fabricating a microelectromechanical structure comprises a first patterned sacrificial layer formed on portions of a substrate, wherein the first patterned sacrificial layer comprises a bulk portion and a protrusion portion. A second patterned sacrificial layer is formed on the first patterned sacrificial layer, covering the protrusion portion and portions of the bulk portion, wherein the second patterned sacrificial layer does not cover sidewalls of the first patterned sacrificial layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Methods of fabricating a microelectromechanical structure will now be described in greater detail. Some embodiments of the invention, such as the exemplary embodiments described, can potentially prevent deformation of or damage to a microelectromechanical structure. In some embodiments, this can be accomplished by formed an overlying patterned sacrificial layer merely overlying a top surface of a underlying sacrificial layer but not covering sidewalls of the underlying sacrificial layer.

Figure 3:
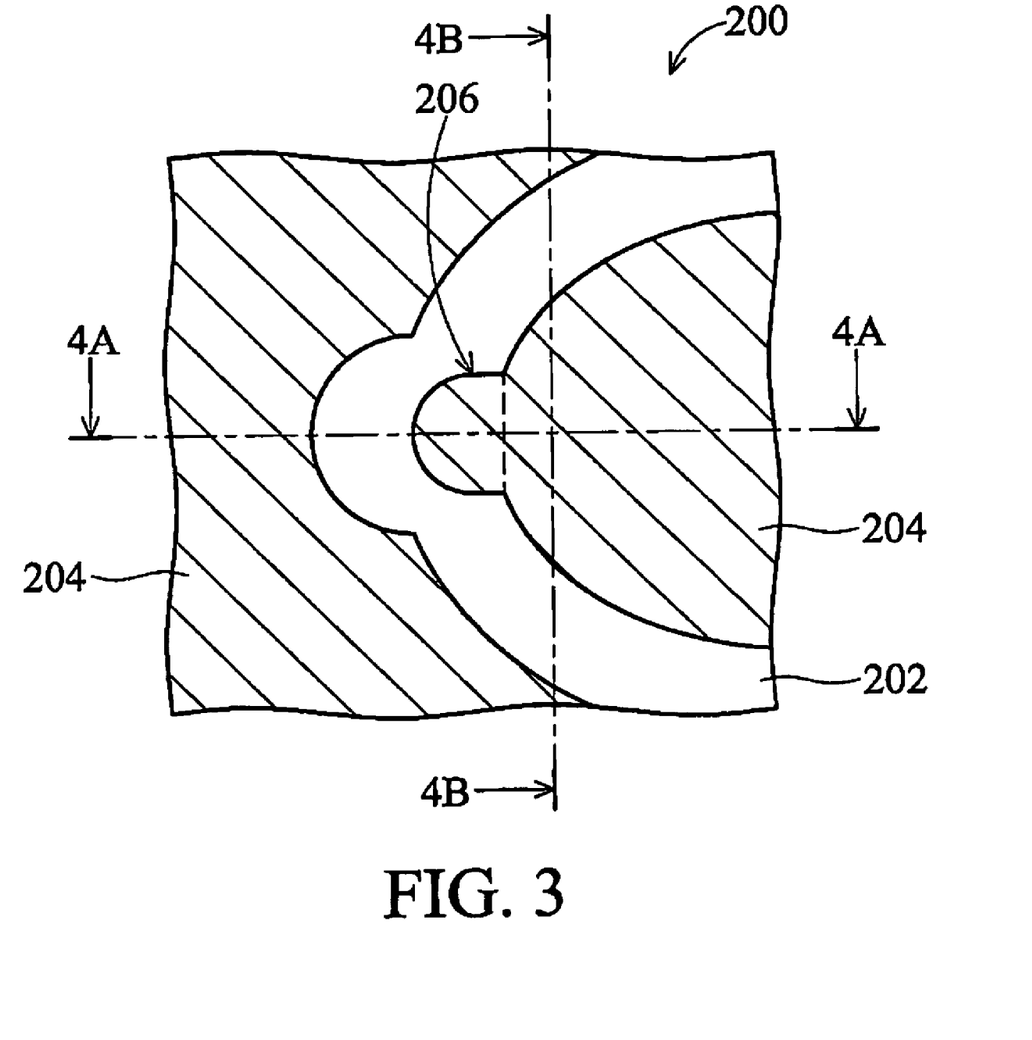
FIGS. 3, 5 and 7 are schematic top views showing a method of fabricating a microelectromechanical structure according to an embodiment of the invention.
Figure 4A:
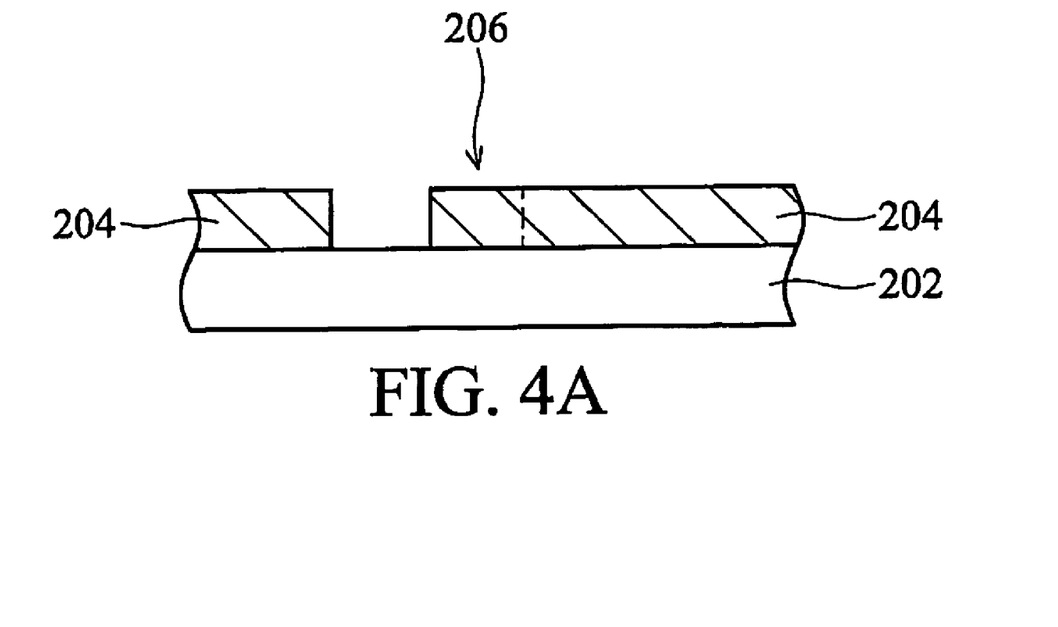
FIGS. 4A and 4B are schematic cross sections taken along lines 4A-4A and 4B-4B of FIG. 3, respectively, each showing an intermediate structure during fabrication.
Figure 4B:
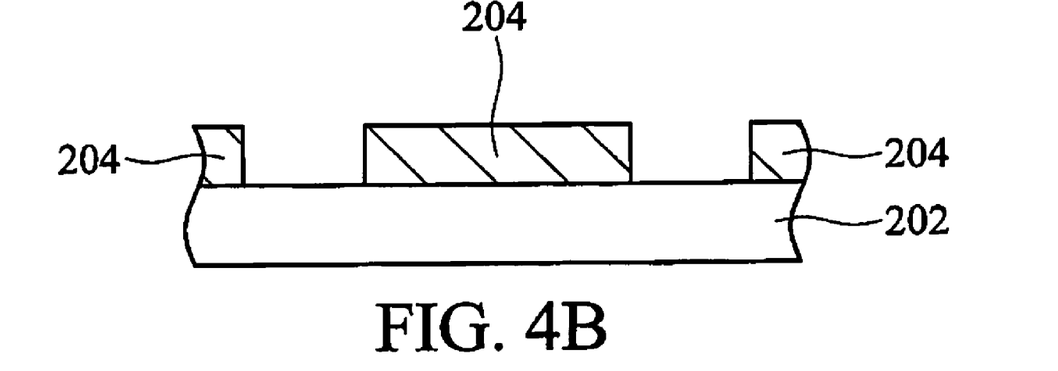
Figure 5:
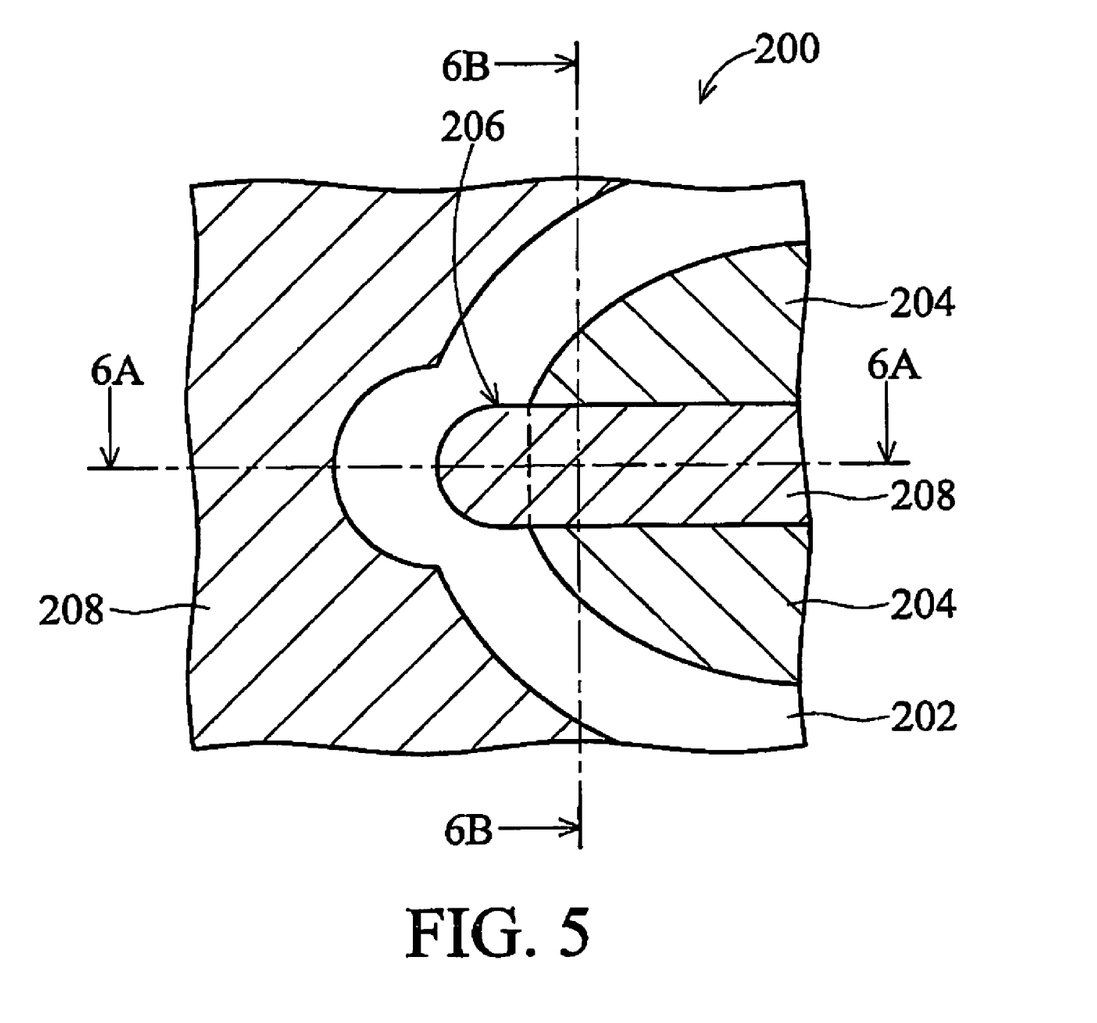
Figure 6A:
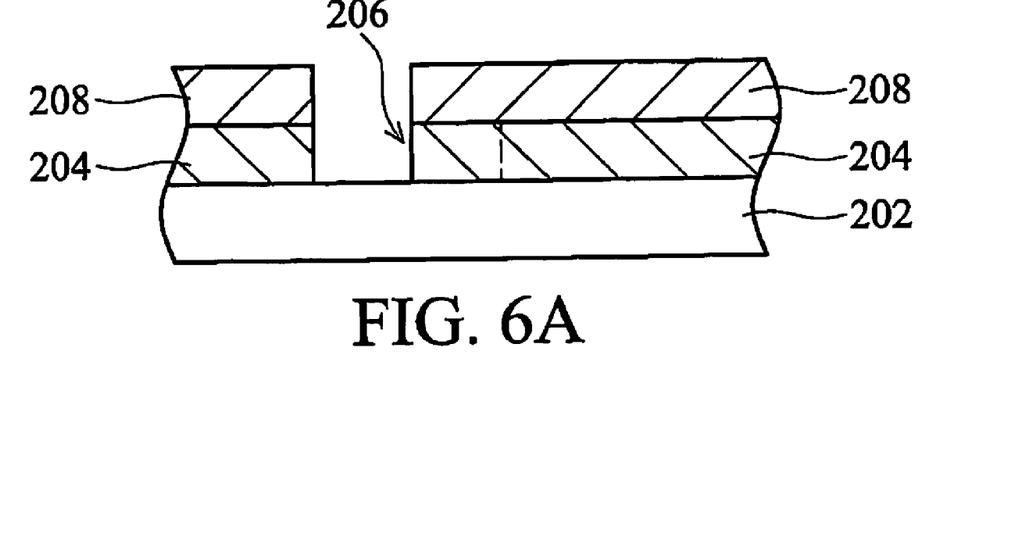
FIGS. 6A and 6B are schematic cross sections taken along lines 6A-6A and 6B-6B of FIG. 5, respectively, each showing an intermediate structure during fabrication.
Figure 6B:
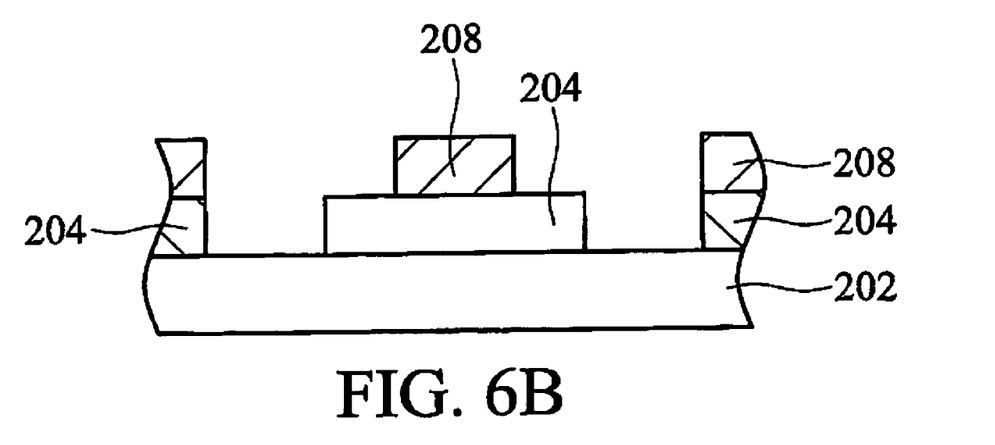
Figure 7:
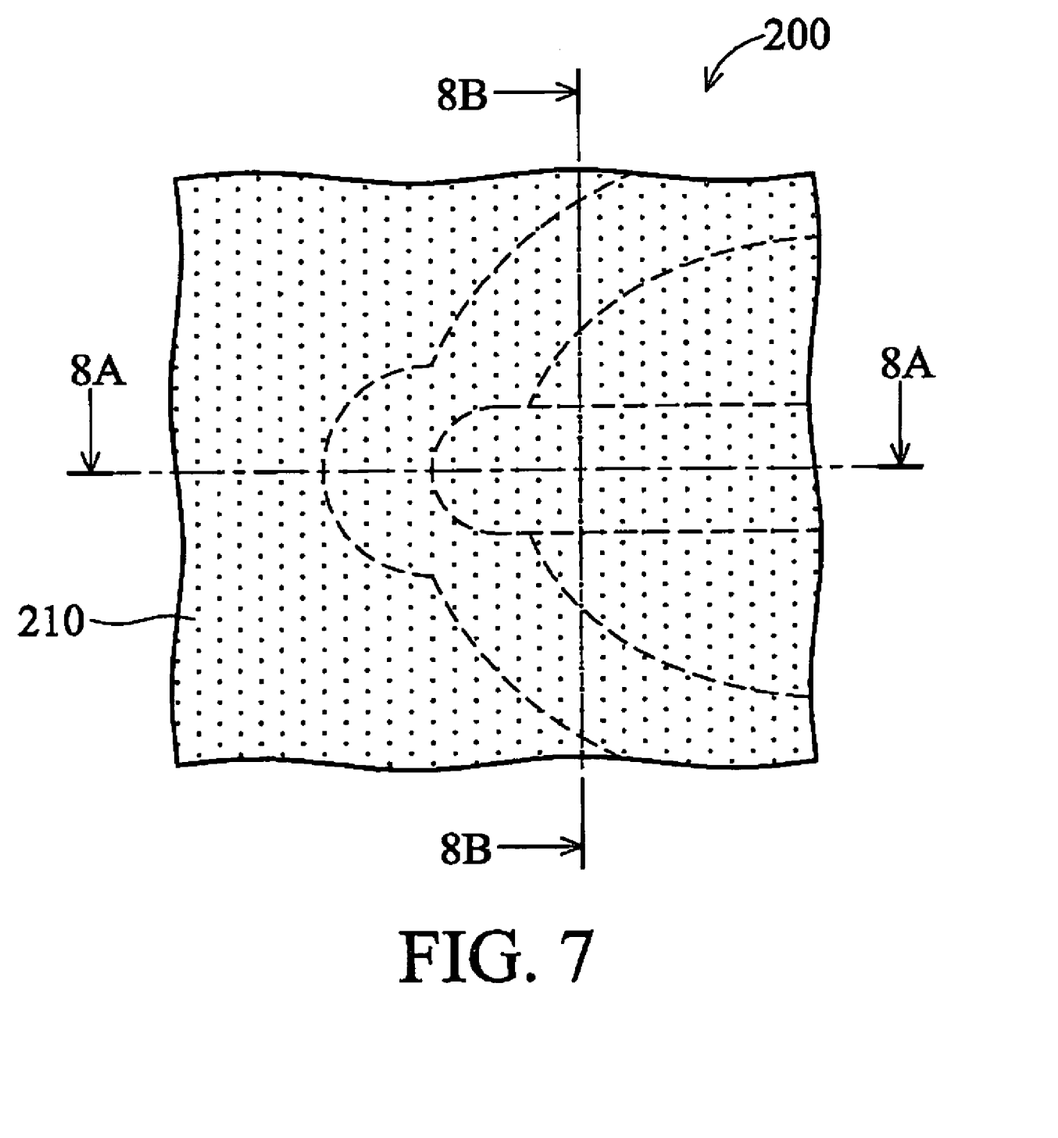

FIGS. 3-8 are schematic diagrams of an embodiment of a method of fabricating a microelectromechanical structure, wherein FIGS. 3, 5 and 7 are schematic top views and FIGS. 4A-4B, 6A-6B and 8A-8B are schematic cross sections taken along lines 4A-4A, 4B-4B, 6A-6A, 6B-6B, 8A-8A and 8B-8B of FIGS. 3, 5 and 7, respectively.

Referring now to the drawings, FIG. 3 shows a schematic top view of a microelectromechanical structure 200. As shown in FIG. 3, the microelectromechanical structure 200 is provided, including a patterned sacrificial layer 204 formed on a substrate 202. Portions of the substrate 202 are exposed by the patterned sacrificial layer 204. The substrate 202 can be, for example, a silicon wafer and the sacrificial layer 204 preferably comprises photosensitive materials such as photoresists, photosensitive polymers or other materials. Therefore, the patterned sacrificial layer 204 can be formed by processes such as photolithography and a subsequent developement.

As shown in FIG. 3, the patterned sacrificial layer 204 comprises a protrusion portion 206 connected to a bulk portion thereof. Both of the protrusion portions 206 and the bulk portion of the patterned sacrificial layer 204 are formed with rounded sidewalls but are not limited thereto, the protrusion portions 206 and the bulk portion of the patterned sacrificial layer 204 can be formed with sidewalls of various shapes. FIG. 4A is a schematic cross section taken along line 4A-4A of FIG. 3, showing portions of the patterned sacrificial layer 204 near the protrusion portion 206 thereof. In addition, FIG. 4B is a schematic cross section taken along line 4B-4B of FIG. 3, showing portions of the patterned sacrificial layer 204 located at the bulk portion thereof which adjacent to the protrusion portion 206 from a different viewing angle.

Referring now to FIG. 5, another patterned sacrificial layer 208 is formed on portions of the patterned sacrificial layer 204 thereunder but not on the substrate 202 and sidewalls of the patterned sacrificial layer 204. As shown on right side of FIG. 5, the patterned sacrificial layer 208 now overlies the entire protrusion portion 206 and portions of the bulk portion of the patterned sacrificial layer 204. Since the patterned sacrificial layer 208 is not formed on the sidewalls of the patterned sacrificial layer 204, no additional stresses are induced. Thus, cracking or peeling of the overlying sacrificial layer as shown in the related art can be avoided. Moreover, the patterned sacrificial layers 204 and 208 have step differences therebetween, thereby providing a mold of three-dimensional pattern for a laterally formed microelectromechanical element (not shown). Herein, the sacrificial layer 208 also preferably comprises photosensitive materials such as photoresists, photosensitive polymers or other materials. Therefore, formation of the patterned sacrificial layer 208 may be formed by processes such as photolithography and a sequential development. FIG. 6A is a schematic cross section taken along line 6A-6A of FIG. 5, now showing portions of the stacked patterned sacrificial layers 204 and 208. In addition, FIG. 6B is a schematic cross section taken along line 6B-6B of FIG. 5, showing portions of the stacked patterned sacrificial layers 204 and 208 located at the bulk portion thereof which adjacent to the protrusion portion 206 from a different viewing angle.

Figure 8A:
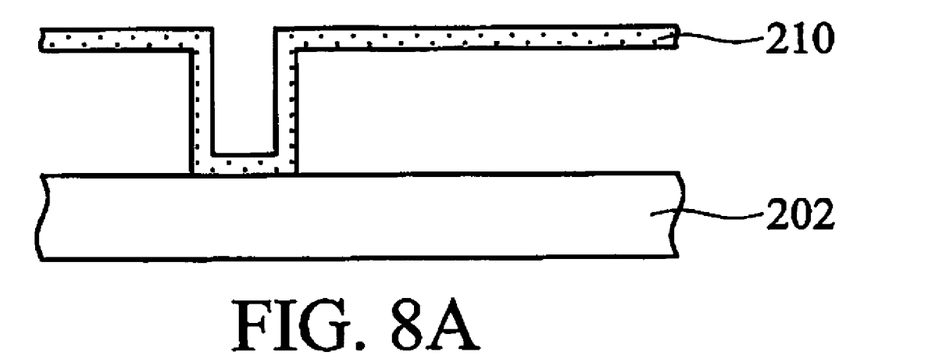
FIGS. 8A and 8B are schematic cross sections taken along lines 8A-8A and 8B-8B of FIG. 7, respectively, each showing an intermediate structure during fabrication.
Figure 8B:
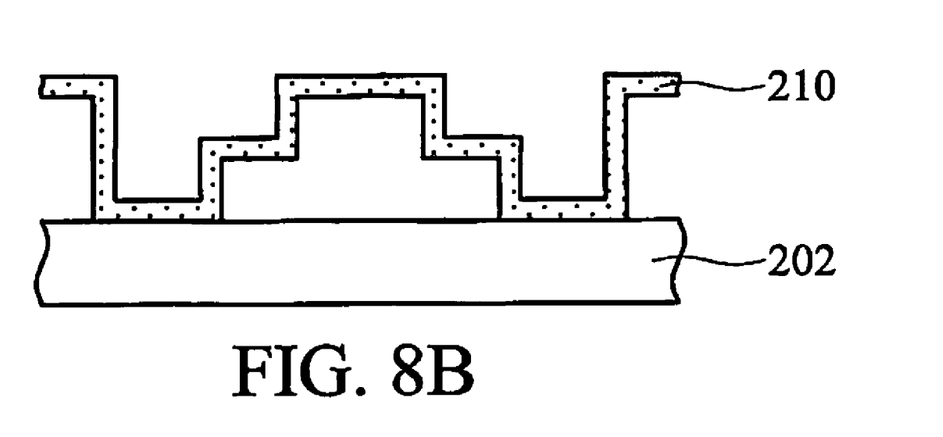

Referring now to FIG. 7, an element layer 210 is next conformably formed over the substrate 202, covering the patterned sacrificial layers 204 and 208. The element layer 210 may be, for example, a dielectric layer or a conductive layer, depending on functions thereof. Next, the patterned sacrificial layers 204 and 208 are both removed by method such as wet etching using etching chemicals or solvents, thereby leaving the element layer 210 on the substrate 202. Since the described cracking or peeling issue of the related art can be avoid or prevented by the above illustrated method, the shapes and functionality of the element layer 210 can be ensured. FIG. 8A is a schematic cross section taken along line 8A-8A of FIG. 7, showing the released element layer 210 conformably formed on the substrate 202. In addition, FIG. 8B is a schematic cross section taken along line 8B-8B of FIG. 7, showing portions of the released element layer 210 from a different viewing angle.

As described, the exemplary methods can potentially prevent deformation or damages of a microelectromechanical structure. In some embodiments, this can be accomplished by forming an overlying patterned sacrificial layer overlying only a top surface of an underlying sacrificial layer but not covering the sidewalls of the underlying sacrificial layer, such as the exemplary embodiment of FIG. 5. A mold for fabricating a microelectromechanical structure is provided, comprising a first patterned sacrificial layer (i.e. the sacrificial layer 204) formed on portions of a substrate, wherein the first patterned sacrificial layer comprises a bulk portion and a protrusion portion. A second patterned sacrificial layer (i.e. the sacrificial layer 208) is formed on the first patterned sacrificial layer, covering the protrusion portion and portions of the bulk portion, wherein the second patterned sacrificial layer does not cover sidewalls of the first patterned sacrificial layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a microelectromechanical structure, comprising:
   providing a substrate;
   forming a first patterned sacrificial layer on portions of the substrate, the first patterned sacrificial layer comprising a bulk portion, a protrusion portion and an opening;
   forming a second patterned sacrificial layer over the first sacrificial layer, covering the protrusion portion and portions of the bulk portion of the first patterned sacrificial layer, wherein the second patterned sacrificial layer does not cover sidewalls and the opening of the first patterned sacrificial layer;
   forming an element layer over the substrate, covering the substrate, the first patterned sacrificial layer and second patterned sacrificial layer; and
   removing the first and second patterned sacrificial layers, leaving a microstructure on the substrate.

2. The method as claimed in claim 1, wherein the first and second patterned sacrificial layers comprise photosensitive materials.

3. The method as claimed in claim 2, wherein the first and second patterned sacrificial layers are patterned by photolithography.

4. The method as claimed in claim 1, wherein portions of the microstructure are suspended above the substrate by a gap therebetween.

5. The method as claimed in claim 1, wherein the bulk portion and the protrusion portion of the first patterned sacrificial layer comprise rounded sidewalls.

6. The method as claimed in claim 1, wherein the element layer comprises conductive materials.

7. The method as claimed in claim 1, wherein the element layer comprises dielectric materials.

8. The method as claimed in claim 1, wherein the substrate is a silicon wafer.

* * * * *